United States Patent
Lewis

(10) Patent No.: US 8,918,706 B1
(45) Date of Patent: Dec. 23, 2014

(54) METHODS AND CIRCUITRY FOR PERFORMING PARALLEL ERROR CHECKING

(71) Applicant: Altera Corporation, San Jose, CA (US)

(72) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 71 days.

(21) Appl. No.: 13/677,181

(22) Filed: Nov. 14, 2012

(51) Int. Cl.
*H03M 13/00* (2006.01)
*H03M 13/05* (2006.01)

(52) U.S. Cl.
CPC ..................................... *H03M 13/05* (2013.01)
USPC .......................................................... 714/781

(58) Field of Classification Search
CPC ............................ H03M 13/09; H03M 13/091
USPC ............................ 714/781, 731, 763, 805, 42
See application file for complete search history.

(56) References Cited

U.S. PATENT DOCUMENTS

| | | | |
|---|---|---|---|
| 5,465,261 A | 11/1995 | Deschene | |
| 5,990,920 A * | 11/1999 | Nagumo et al. | 347/237 |
| 6,982,900 B2 | 1/2006 | Hirabayashi | |
| 7,219,272 B2 | 5/2007 | Osada et al. | |
| 2004/0237001 A1 * | 11/2004 | Schulz et al. | 714/42 |
| 2012/0221919 A1 | 8/2012 | Ekas et al. | |

OTHER PUBLICATIONS

Lewis et al., "Transforming Bit-Serial Communication Circuits into Fast Parallel VLSI Implementations," IEEE Journal of Solid-State Circuits, vol. 23, No. 2, Apr. 1988 (9 pages).

* cited by examiner

*Primary Examiner* — Fritz Alphonse
(74) *Attorney, Agent, or Firm* — Treyz Law Group; Jason Tsai

(57) ABSTRACT

Integrated circuits with a memory array may include error checking circuitry for detecting, locating, and correcting soft errors in the memory array. The error checking circuitry may include row cyclic-redundancy-check (CRC) circuits each of which is operable to receive bits from respective groups of memory elements in the array and may also include an array CRC circuit. In one embodiment, the row CRC circuits compute CRC values based on bits stored in each of the memory elements in the respective groups of memory without the use of the array CRC circuit. After all of the columns have been read out, the array CRC circuit may be used to combine the CRC values from the different row CRC circuits. In another embodiment, the array CRC circuit may update the array CRC value each time the row CRC circuits update their CRC values in response to selecting a new column for readout.

20 Claims, 8 Drawing Sheets

METHODS AND CIRCUITRY FOR PERFORMING PARALLEL ERROR CHECKING

BACKGROUND

This relates to integrated circuits and more particularly, to circuitry for detecting memory errors on integrated circuits such as programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the tools generate configuration data. The configuration data is loaded into memory elements to configure the devices to perform the functions of the custom logic circuit.

Memory elements are often based on random-access-memory (RAM) cells. Because the RAM cells are loaded with configuration data during device programming, the RAM cells are sometimes referred to as configuration memory or configuration random-access-memory cells (CRAM).

During normal operation of a programmable device, the CRAM cells produce static output signals that are applied to the gates of transistors (e.g., pass transistors). The CRAM output signals turn some transistors on and turn other transistors off. This selective activation of certain transistors on the device customizes the operation of the device so that the device performs its intended function.

When operating in a system, programmable devices are subject to environmental background radiation. Particularly in modern programmable devices that contain large numbers of CRAM cells, there is a possibility that a radiation strike on a CRAM cell will cause the CRAM cell to change its state. For example, a CRAM cell storing a "1" configuration bit may flip its state so that the cell erroneously stores a "0" bit. When a CRAM cell changes state, the transistor that is controlled by that CRAM cell will be placed into an erroneous state. The transistor might, for example, be turned on when it should have been turned off.

Radiation-induced errors that arise in configuration random-access-memory cells are sometimes referred to as soft errors. One way in which soft errors can be addressed is to change the design of the configuration random-access-memory cells. However, changes to the configuration random-access-memory cells can introduce undesired circuit complexity and can consume additional circuit real estate.

Programmable devices sometimes include error detection circuitry that continuously monitors an entire array of CRAM cells. If an error is detected in the array, an error flag may be set. Systems that require highly reliable operations can monitor the status of the error flag to determine whether the programmable device has experienced any soft errors. So long as no errors are present, the system allows the programmable device to operate normally. If, however, the state of the error flag indicates that one of the configuration random-access-memory cells on the device has exhibited a soft error, the system can reconfigure the device by reloading the original configuration data into the configuration random-access-memory cells. Reloading the entire programmable device every time a soft error is detected may, however, result in unnecessarily frequent disruptions and may consume significant amounts of power.

Conventional error detection circuitry such as error detection circuitry that uses cyclic redundancy check (CRC) may perform sequential data checking. The speed of error checking using this sequential approach is limited by the number of data bits that can be processed per clock cycle. For example, conventional error checking circuitry that uses CRC may require more than several million clock cycles to determine whether soft errors are present on a programmable device with 100 million CRAM cells. Performing error checking using the convention approach may be undesirably time-consuming.

SUMMARY

Integrated circuits such as programmable integrated circuits may have memory elements coupled to error checking and control circuitry. The error checking circuitry may be used for detecting, locating, and correcting soft errors in the memory elements.

For example, a programmable integrated circuit may contain one or more arrays of configuration random-access-memory (CRAM) cells. Each array may contain rows and columns of configuration random-access-memory cells that are used for storing configuration data. The integrated circuit may also be organized into different logic regions, each logic region having its own set of memory arrays.

Memory cells that are connected to a common address line may collectively be referred to as a memory cell column. Memory cells that are connected to a common data line (or bit line) may collectively be referred to as a memory cell row. The terms "rows" and "columns" may sometimes be used interchangeably. The address lines may be connected to at least one address register, whereas the data lines may be connected to a data register.

The error checking circuitry may include multiple row cyclic redundancy check (CRC) circuits and an array CRC circuit. In one suitable arrangement, each row CRC circuit may receive data from a respective row of memory elements via the data register. The row CRC circuits may be coupled in a chain. At least some pipeline registers may be interposed in the chain. Each time a column of memory elements is selected for readout, the row CRC circuits may compute new corresponding CRC values while the array CRC circuit updates an array CRC value based on CRC values received from the chain of row CRC circuits. The array CRC circuit may include a CRC delay circuit operable to delay CRC computation by a number of bits that is at least equal to the total number of row CRC circuits.

In another suitable arrangement, each row CRC circuit may be operable to serially receive data from different portions of a selected memory column. Data from each group of selected memory elements can be latched using a data register. Bits temporarily stored in the data register may be serially fed to corresponding row CRC circuits via associated multiplexing circuits or shift registers (as examples). The array CRC circuit may process CRC values from the row CRC circuits only after the row CRC circuits have finished computing CRC values based on data received from all the memory elements. The array CRC circuit may include a CRC delay circuit operable to delay CRC computation by a number of bits that is at least equal to the number of rows that is associated with each row CRC circuit. In either arrangement, error control circuitry may be used to generate control signals for controlling the operation of the data register, row CRC circuits, and the array CRC circuit.

Further features of the present invention, its nature and various advantages will be more apparent from the accompanying drawings and the following detailed description.

DETAILED DESCRIPTION

Embodiments of the present invention relate to integrated circuits and more particularly, to integrated circuits with memory elements.

Integrated circuits that contain memory elements may include memory chips, digital signal processing circuits with memory arrays, microprocessors, application specific integrated circuits with memory arrays, programmable logic device integrated circuits or other programmable integrated circuits in which memory elements are used for configuration memory, or other suitable integrated circuits.

Integrated circuits such as programmable integrated circuits use programmable memory elements to store configuration data. During the programming of a programmable integrated circuit, configuration data is loaded into the memory elements. During operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
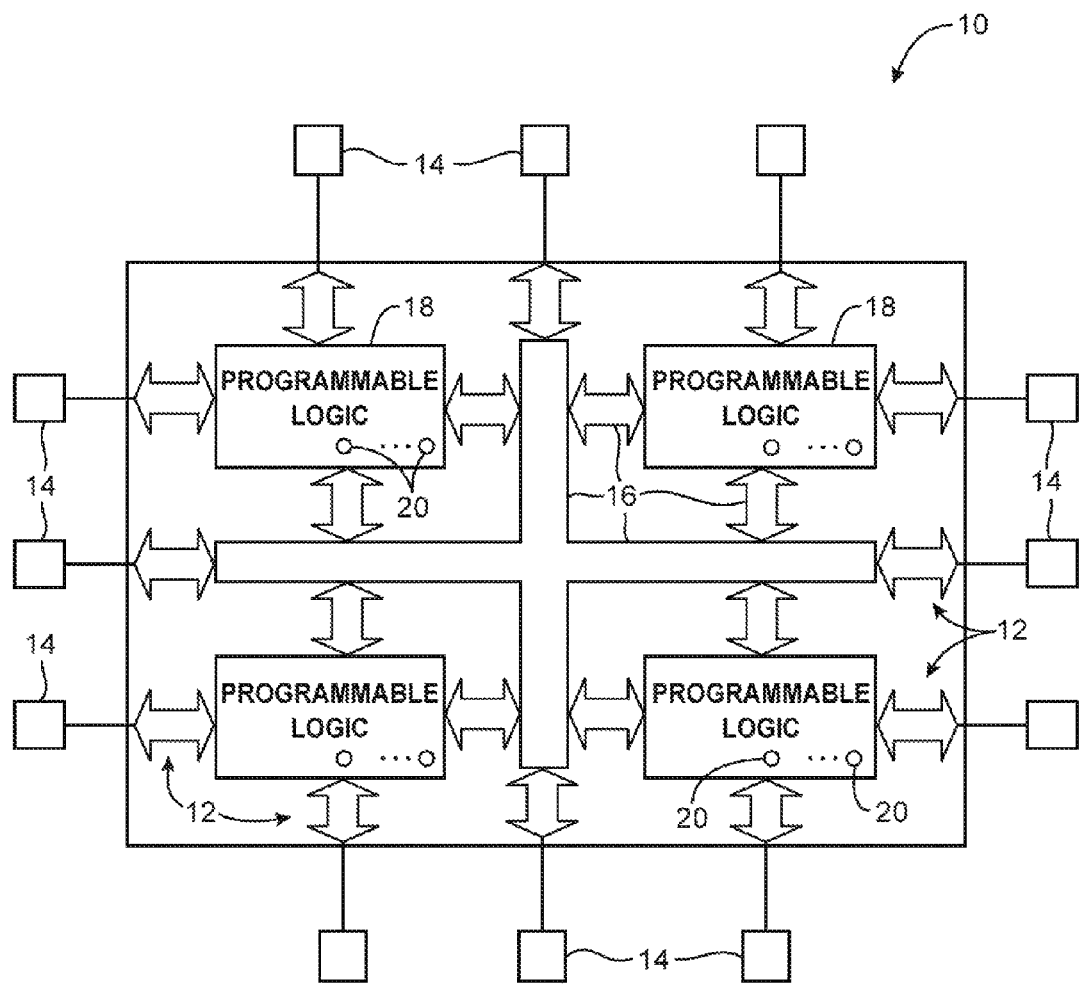
FIG. 1 is a diagram of an illustrative programmable integrated circuit in accordance with an embodiment of the present invention.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic or routing component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
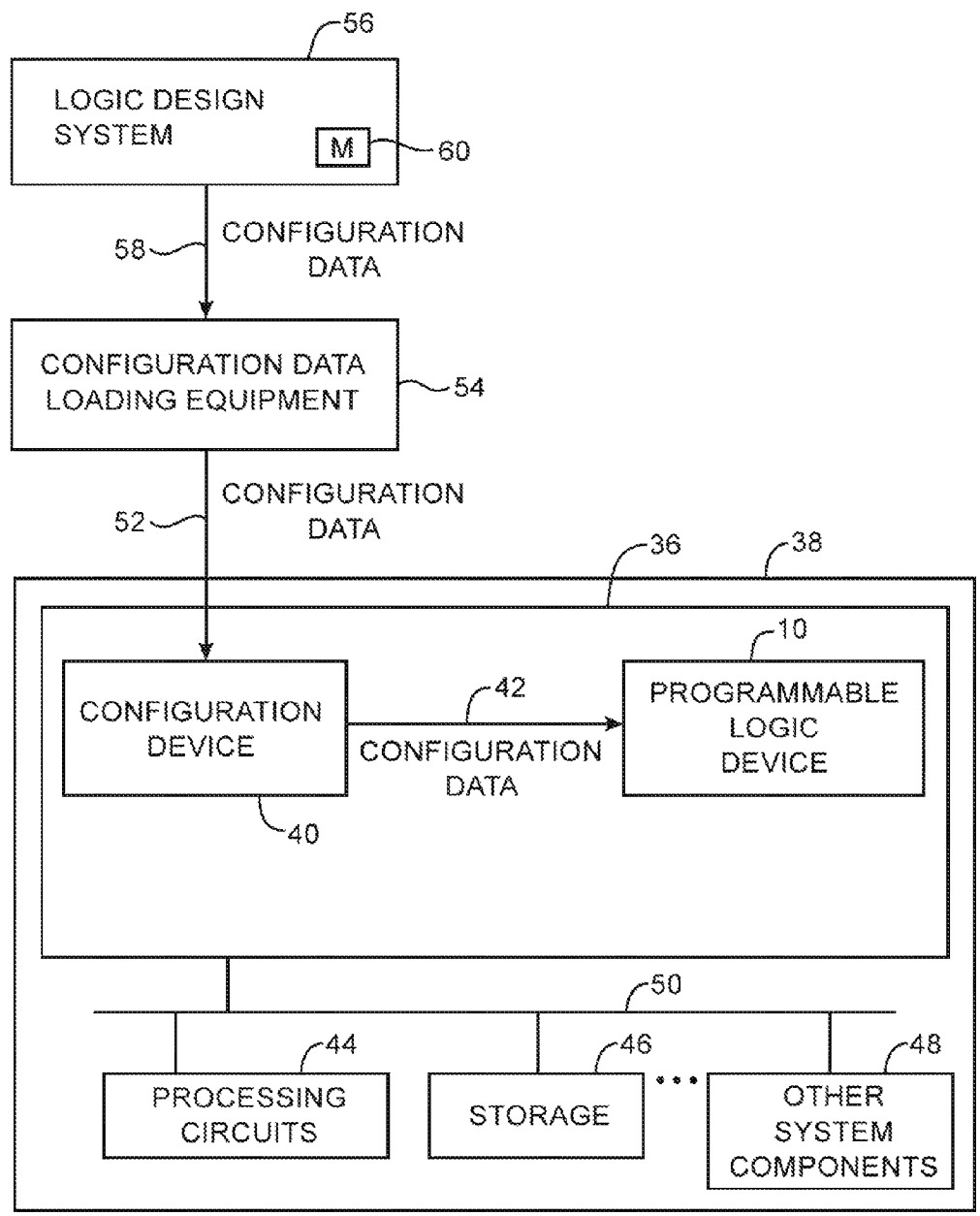
FIG. 2 is a diagram showing creation of configuration data by a logic design system and configuring the device for operation in a system based on the configuration data in accordance with an embodiment of the present invention.

An illustrative system environment for device 10 is shown in FIG. 2. Device 10 may be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50.

Configuration device 40 may be supplied with the configuration data for device 10 over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. In general, software and data may be stored on any computer-readable medium (storage) in system 56 and is shown schematically as storage 60 in FIG. 2.

In a typical scenario, logic design system 56 is used by a logic designer to create a custom circuit design. The system 56 produces corresponding configuration data which is provided to configuration device 40. Upon power-up, configuration device 40 and data loading circuitry on programmable logic device 10 is used to load the configuration data into CRAM cells 20 of device 10. Device 10 may then be used in normal operation of system 38.

Figure 3:
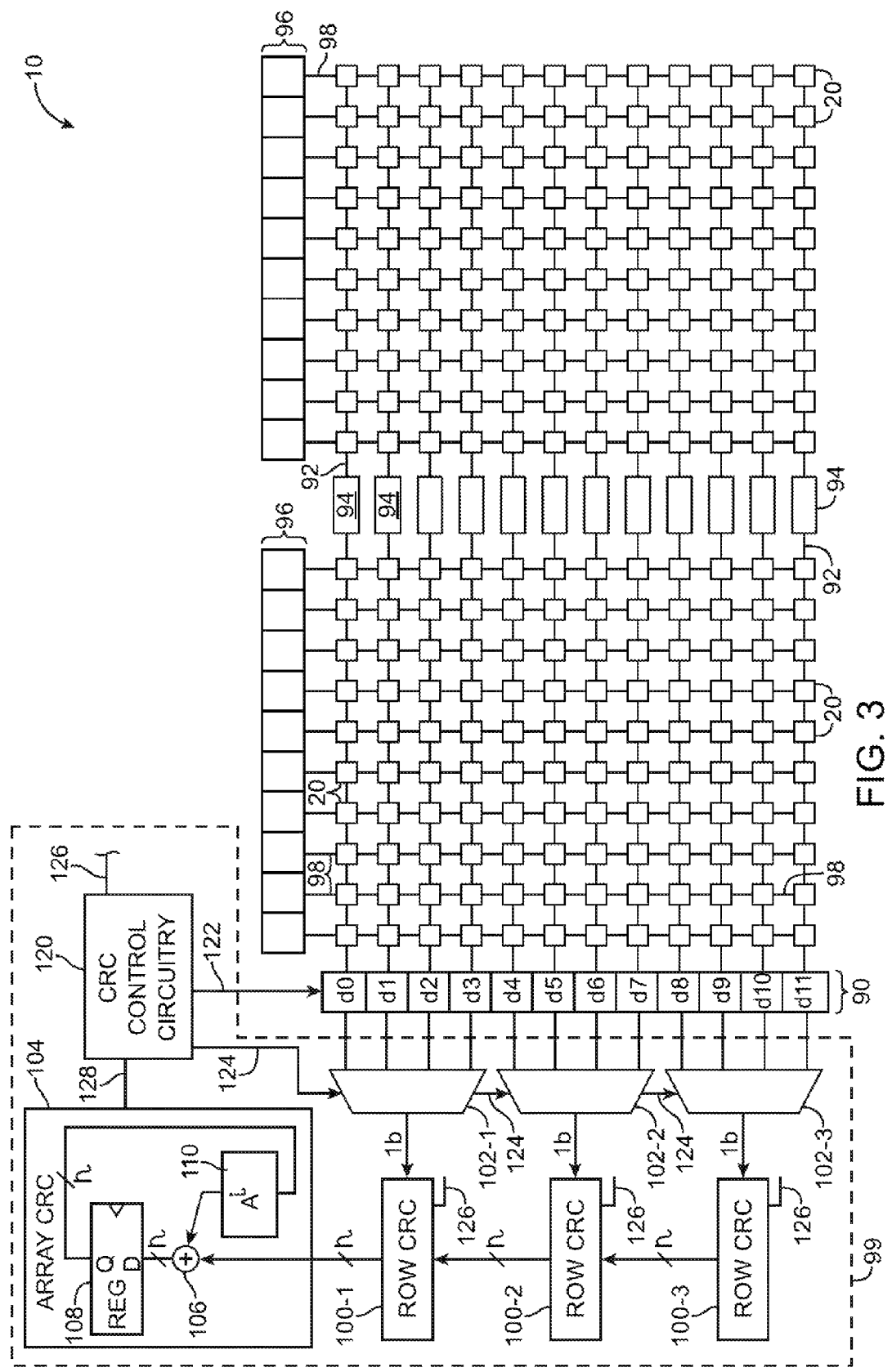
FIG. 3 is a diagram of an illustrative integrated circuit having cyclic redundancy check (CRC) circuitry that includes respective CRC circuits each of which is operable to compute a corresponding CRC value for an associated group of memory elements in accordance with an embodiment of the present invention.

FIG. 3 shows an integrated circuit 10 with memory elements and associated error checking and control circuitry. As shown in FIG. 3, device 10 may include memory elements 20 arranged in an array. Memory elements 20 may be random-access-memory (RAM) elements such as static random-access-memory (SRAM) cells or configuration random-access-memory (CRAM) cells, non-volatile memory elements, or other types of memory elements.

Each column of cells 20 may be coupled to a respective address line 98. For example, a first column of cells 20 may be connected to first address line 98 (e.g., an address line on which a first address signal is supplied), whereas a second column of cells 20 may be connected to second address line 98 (i.e., an address line on which a second address signal is supplied), etc.

In the example of FIG. 3, cells 20 may be organized into different sub-arrays, each of which includes ten columns of cells 20. Each memory sub-array may receive address signals from a corresponding address register 96. For example, a first sub-array of cells may be controlled by address signals provided by a first address register 96, whereas a second sub-array of cells may be controlled by address signals provided by a second address register 96, etc. First and second address registers 96 may be considered to be part of a single address register.

The arrangement of FIG. 3 is merely illustrative. If desired, the memory array of device 10 may be arranged into groups of any desired size (e.g., each sub-array of cells may include more than ten cell columns, less than ten cell columns, one thousand or more cell columns, ten thousand or more cell columns, etc.). Each address register 96 may have a length that is equal to the number of cell columns in each sub-array of cells. Each memory sub-array may include more than 12 cell rows, less than 12 cell rows, one thousand or more cell rows, ten thousand or more cell rows, etc.). Buffers may be included in the address lines 98 if the address lines are physically long. The terms "rows" and "columns" may sometimes be used interchangeably.

Each row of cells 20 may be connected to a respective data line 92 (sometimes referred to as a bit-line). For example, a first row of cells may be coupled to first data line 92, whereas a second row of cells 20 may be connected to second data line 92, etc. Data lines 92 that are associated with a given sub-array of cells may be coupled to data lines 92 that are associated with an adjacent sub-array of cells through respective data line buffers such as data line buffers (DLBs) 94 (see, e.g., FIG. 3). For example, data line 92 that is associated with the first row of cells in the first sub-array may be coupled to data line 92 that is associated with the first row of cells in the second sub-array through a first DLB 94.

Data lines 92 may be coupled to data register 90. Data register 90 may be formed from a chain of data storage elements such as flip-flops (sometimes referred to as data bit storage elements). Data register 90 may serve to latch data from a selected column of memory cells 20 in parallel. For example, the first data line 92 associated with the first row of memory cells 20 may be coupled to a first flip-flop in a first bit position in data register 90 (e.g., the flip-flop that is storing memory data bit d0), whereas the second data line 92 associated with the second row of memory cells 20 may be coupled to a second flip-flop in a second bit position in data register 90 (e.g., the flip-flop that is storing memory data bit d1), and so on. In other suitable arrangements, data register 90 may be implemented using multiple shift registers each of which is coupled to corresponding data lines 92 in an interleaved fashion.

The array of memory cells may be coupled to error checking and control circuitry 99. Circuitry 99 may be configured to implement error detection algorithms such as a cyclic redundancy check (CRC) code and may therefore sometimes be referred to as CRC circuitry. Error checking circuitry 99 may be used to detect error(s) in the array of memory cells 20, identify the location of the detected error(s), and/or optionally correct the identified error(s).

In the arrangement of FIG. 3, circuitry 99 may include multiple row CRC circuits 100 (e.g., row CRC circuits 100-1, 100-2, and 100-3), multiplexing circuits 102 (e.g., multiplexing circuits 102-1, 102-2, and 102-3), an array CRC circuit 104, and CRC control circuitry 120 for coordinating the operation of the different row CRC circuits 100 and array CRC circuit 104 during error checking operations. In particular, multiplexers 102 may be coupled between row CRC circuits 100 and data register 90.

As shown in the example of FIG. 3, multiplexer 102-1 may have inputs operable to receive bits d0-d3 from data register 90 and an output that is coupled to an input of row CRC circuit 100-1 (e.g., multiplexer 102-1 may be configured to selectively route one of bits d0-d3 to its output); multiplexer 102-2 may have inputs operable to receive bits d4-d7 from data register 90 and an output that is coupled to an input of row CRC circuit 100-2 (e.g., multiplexer 102-2 may be configured to selectively route one of bits d4-d7 to its output); and multiplexer 102-3 may have inputs operable to receive bits d8-d11 from data register 90 and an output that is coupled to an input of row CRC circuit 100-3 (e.g., multiplexer 102-3 may be configured to selectively route one of bits d8-d11 to its output). The state of each multiplexer 102 may be set using control signals provided from CRC control circuitry 120 via path 124.

Third row CRC circuit 100-3 may have an output on which an n-bit CRC value for representing a current state of error for all memory bits in rows 8-11 (i.e., 4*10*2 or 80 memory data bits in the example of FIG. 3) is provided. Second row CRC circuit 100-2 may have an output on which an n-bit CRC value for representing a current state of error for all memory bits in rows 4-7 is provided. First row CRC circuit 100-1 may have an output on which an n-bit CRC value for representing a current state of error for all memory bits in rows 0-3 is provided. Row CRC circuits 100 may be controlled using control signals such as clock signals provided from CRC control circuitry 120 via path 126.

Figure 4A:
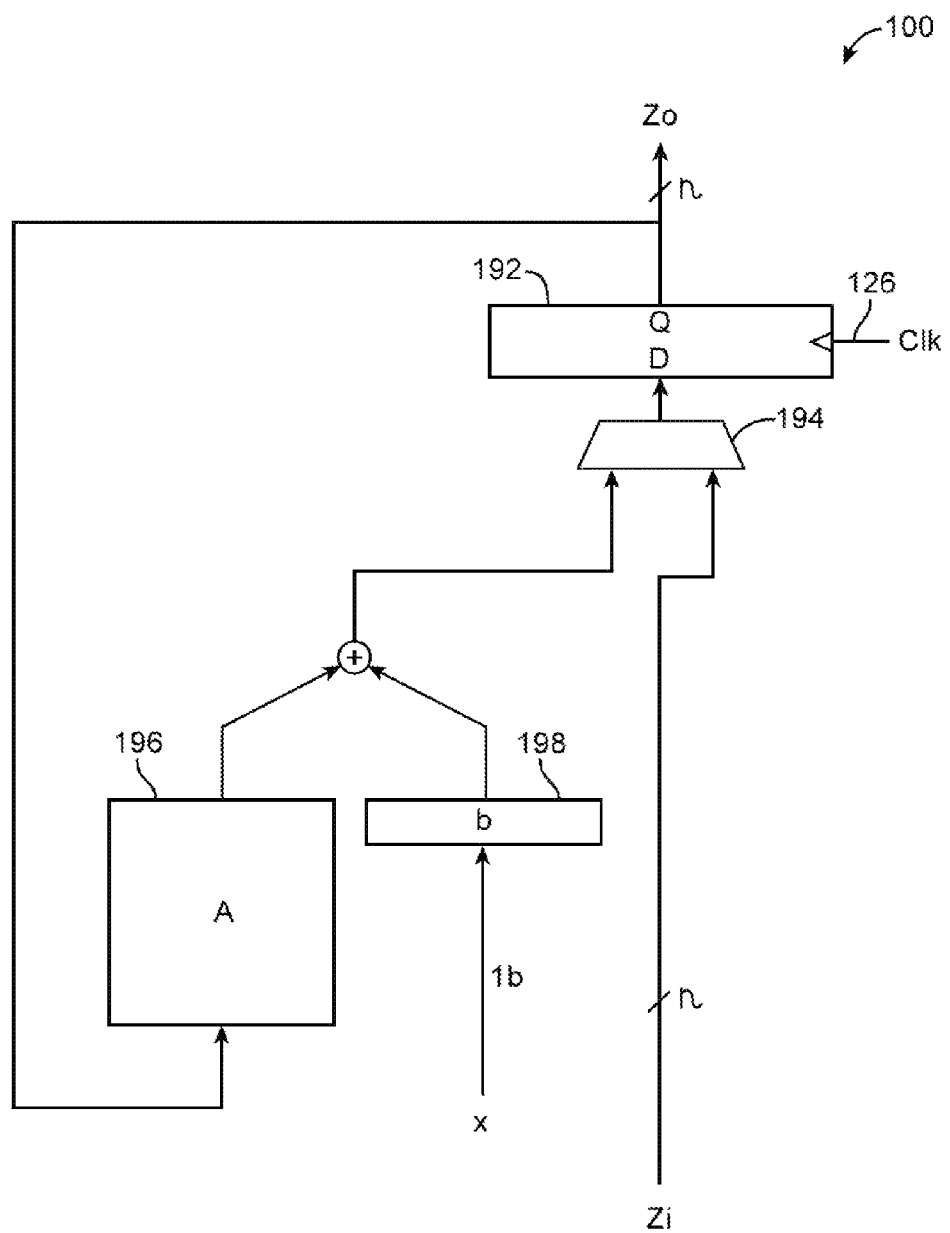
FIG. 4A is a diagram of an illustrative CRC circuit in accordance with an embodiment of the present invention

FIG. 4A shows an illustrative mathematical representation of row CRC circuit 100. As shown in FIG. 4A, row CRC circuit 100 may receive an incoming bit x that is multiplied with a vector b (198) and may receive an n-bit CRC value Zi that is multiplied with a matrix A (196). Vector b includes entries indicating the bit locations in Zi that should be XORed with input bit x, whereas matrix A includes a transpose of vector b in a first column and a diagonal offset by one column indicating the shift of each bit. The resulting XORed product may be latched by register 192 to produce n-bit CRC value Zo. Row CRC circuit 100 of the type described in connection with FIG. 3 may take latched CRC value Zo from the previous iteration as input CRC value Zi in a current iteration or may shift in the CRC value from a previous row CRC by means of multiplexer 194. Multiplexer 194 is used to select the output of the calculation A*Z+b*x during generation of the CRC, or the Zi value during shifting of the CRC results.

Figure 4B:
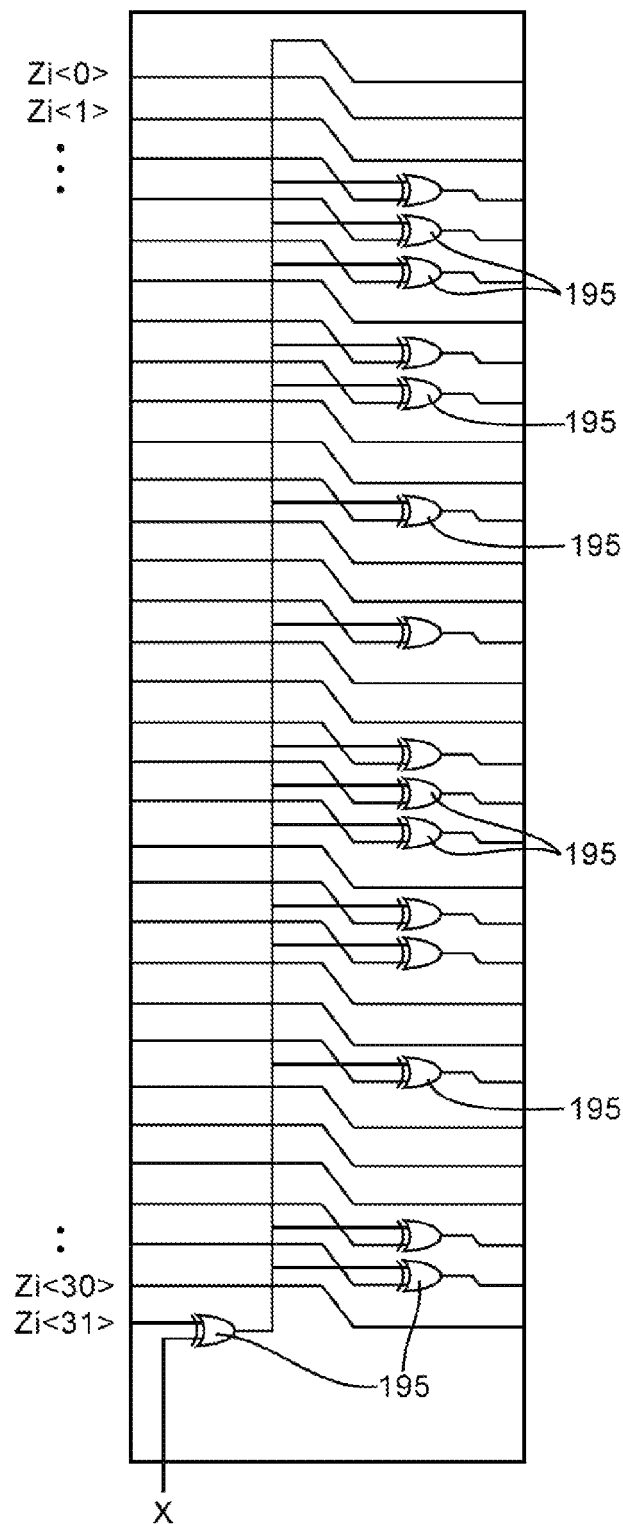
FIG. 4B is a diagram of one suitable circuit implementation of the CRC circuit of FIG. 4A in accordance with an embodiment of the present invention.

FIG. 4B shows one suitable circuit implementation of the A*Z+b*x components of row CRC circuit 100 that is operable to produce a 32-bit CRC output value. As shown in FIG. 4B, row CRC circuit 100 may include logic XOR gates 195 at predetermined locations (e.g., locations determined by vector b) for performing XOR operations on some of the shifted bits (i.e., bits that have been shifted by some offset according to matrix A) and input bit x. This is merely illustrative. In general, row CRC circuit 100 may be configured to produce CRC output values with any desired bit-width based on any prespecified vector b and matrix A.

Referring back to FIG. 3, each row CRC circuit 100 may sequentially process memory data bits from data register 90 in a time-multiplexed fashion. For example, a first column of cells may be selected during a first time period. During the first time period, data from the first column may be read and loaded into data register 90. Each multiplexer 102 may then sequentially route the latched memory data bits from each of its inputs to a respective row CRC circuit 100. Each group of data bits stored in data register 90 at any given point in time that is associated with a given multiplexer 102 may be referred to collectively as a "data word." For example, data bits d0-d3 corresponding to four bits read back from four corresponding memory cells in the current selected column may be referred to as a 4-bit data word.

During a second time period following the first time period, a second column of cells may be selected so that data from the second column may be read and loaded into data register 90. Each multiplexer 102 may then sequentially route the latched memory data bits from each of its inputs to the respective row CRC circuit 100. Row CRC circuits 100 may continue to receive read memory data bits and update their CRC output values in this way until each column in the memory array has been processed. In other suitable arrangements, shift registers may be used in place of multiplexers 102 to load data from rows, and then serially shift data towards row CRC circuits 100.

The example of FIG. 3 in which error checking circuitry 99 includes three 4:1 multiplexers 102 is merely illustrative and does not serve to limit the scope of the present invention. If desired, device 10 may include memory arrays with more than 12 rows and any suitable number of multiplexing circuits with an appropriate number of inputs to receive all the data bits from data register 90 in parallel. For example, consider a scenario in which device 10 includes a memory array with 10,000 columns and 8:1 multiplexing circuits 102. In this example with eight rows per CRC circuit and 10,000 bits per row, each row CRC 100 would need to generate at least a 17-bit CRC output value to detect single-bit errors or an even larger CRC output (i.e., n has to be greater than 17) to detect multiple adjacent errors in each group of 80,000 memory bits. In this example, each row CRC circuit 100 should operate at a speed of at least 8/Tread (where Tread is the column read latency) without imposing unnecessary limits on normal memory operation.

When all the memory data bits have been processed by the different row CRC circuits 100, array CRC circuit 104 may be used to combine the results from each of the different row CRC circuits 100. During this period the multiplexers 194 are configured to shift data through the row CRCs. Array CRC circuit 104 may include a logic exclusive-OR (XOR) circuit 106, a storage component such as register 108, and a CRC delay circuit 110. In particular, logic XOR circuit 106 may have a first input operable to receive an n-bit CRC output value from uppermost row CRC circuit 100-1, a second input operable to receive an n-bit CRC output value from CRC delay circuit 110, and an output on which an updated CRC value is provided (e.g., an updated CRC value that is generated by XORing the two n-bit CRC values received at its first and second inputs). Register 108 may have an input terminal (D) that receives the updated CRC value from the output of logic XOR circuit 106, an output terminal (Q) on which a currently latched CRC value is provided to an input of CRC delay circuit 110, and a clock input operable to receive a clock signal from control circuitry 120 via path 128.

Delay circuit 110 may serve to implement desired bit shifting as specified by matrix A. Matrix A in array CRC circuit 104 may be the same or may be different from matrix A (196) as described in connection with row CRC circuit 100 (see, FIG. 4A). In particular, array matrix A may be raised to an i-th power to effectively delay the position of each incoming CRC by i bit positions. Generally, the power i to which array matrix A should be raised may be determined based on the number of memory bits that have been processed using each row CRC circuit 100. In the example of FIG. 3, i may be equal to 80 since each row CRC circuit 100 is being used to compute an n-bit CRC value for 80 memory elements 20 (i.e., for each group of 4*10*2 memory elements). As another example in which each row CRC circuit 100 receives bits from an 8-bit multiplexer 102 and in which each row contains 10,000 bits, i may be equal to 80,000 (i.e., for each group of 8*10,000 memory elements).

In one suitable arrangement, array CRC circuit 104 may have parallel inputs that receive all n bits from row CRC circuit 100-1 in a single clock cycle (as is shown in FIG. 3). In other suitable arrangements, array CRC circuit 104 may have a single input to process the bits from row CRC circuit 104 serially, may be operable to receive a fraction of bits from row CRC circuit 104, may be operable to receive bits from multiple row CRC circuits 100 per cycle, etc.

When the CRC value from topmost row CRC circuit 100-1 has been used to update the array CRC output value (e.g., when array CRC circuit 104 has latched a new CRC output value by clocking register 108), the CRC values from the lower CRC circuits 100 may be shifted up one level so as to replace the previous CRC values. For example, consider the scenario of FIG. 3 in which the three row CRC circuits have just finished processing all 240 bits (i.e., 12*10*2) in the memory array. In a first subsequent clock cycle, array CRC circuit 104 may receive a CRC value from circuit 100-1 and latch a corresponding array CRC output.

In a second subsequent clock cycle immediately following the first clock cycle, the contents of circuit 100-2 may be shifted up one level to replace the old contents of circuit 100-1 while the contents of circuit 100-3 may be shifted up one level to replace the old contents of circuit 100-2. During the second clock cycle, array CRC circuit 104 may again update the array CRC output based on the new contents that have just been loaded into circuit 100-1.

In a third subsequent clock cycle immediately following the second clock cycle, the contents of circuit 100-2 may be shifted up one level to replace the old contents of circuit 100-1 (e.g., circuit 100-3 has already been emptied). During the third clock cycle, array CRC circuit 104 may again update the array CRC output based on the new contents that have just been loaded into circuit 100-1. This example of shifting row CRC contents is merely illustrative and can be extended to error checking circuitry 99 having any suitable number of row CRC circuits 100.

Figure 5:
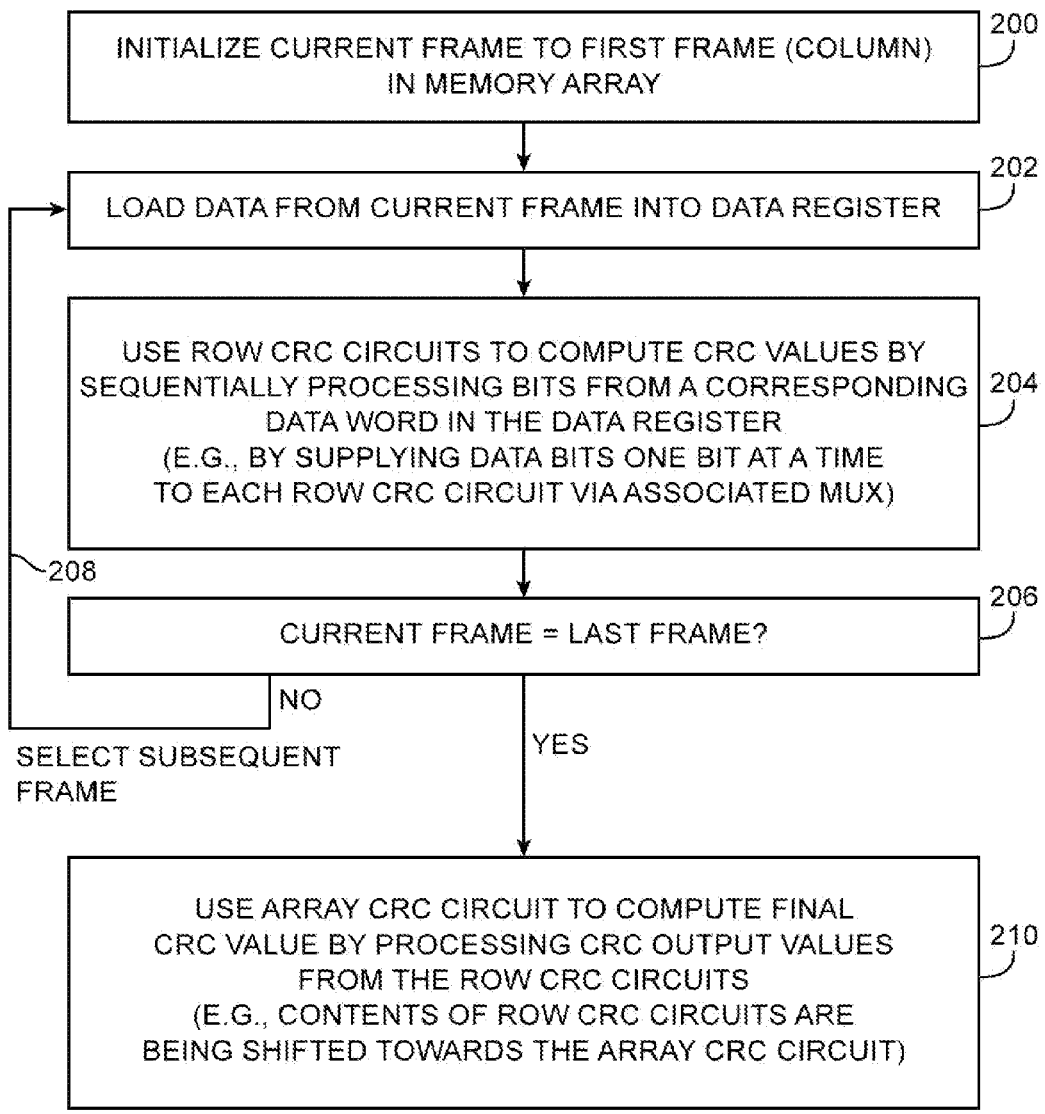
FIG. 5 is a flow chart of illustrative steps for performing error checking using CRC circuitry of the type shown in FIG. 3 in accordance with an embodiment of the present invention.

FIG. 5 is a flow chart of illustrative steps for performing error checking using circuitry 99 of the type described in connection with FIG. 3. At step 200, the current frame may be initialized to the first frame (column) in the memory array on device 10.

At step 202, memory cells in the current frame may be selected and read out to data register 90. At step 204, the different row CRC circuits 100 may simultaneously be used to process the memory bits one bit at a time from corresponding data words currently latched in data register 90 (e.g., by supplying data bits one bit at a time to each row CRC circuit via associated multiplexing circuits or shift registers).

If the current frame is not the last frame in the memory array (as determined during step 206), processing may loop back to step 202 to select a subsequent frame for readout (as indicated by path 208). If the current frame is the last frame in the memory array, processing may continue to step 210.

At step 210, array CRC circuit 104 may be used to compute a final CRC value by processing the CRC output values from each of the row CRC circuits 100 (e.g., by sequentially shifting the contents of the row CRC circuits up towards the array CRC circuit and updating the final CRC value using the array CRC circuit). The final array CRC output value computed in this way may be used to determine the presence of an error (i.e., a single-bit error or an adjacent multi-bit error) and the location of the detected error.

Computing an array CRC output value in this way may be substantially faster than convention error-correcting code (ECC) algorithms. The example of FIG. 3 in which row CRC circuits 100 have the same complexity (or bit width) as array CRC circuit 104 illustrates a relatively simplistic case. However, this requires that the row CRC output values be a relatively large polynomial since the array CRC should be capable of identifying different types of errors in the entire memory array (e.g., single-bit errors, adjacent multi-bit errors, etc.). If desired, row CRC circuits 100 may be configured to output CRC values having a bit width that is smaller than the bit width associated with array CRC circuit 104 to reduce the hardware overhead.

Figure 6:
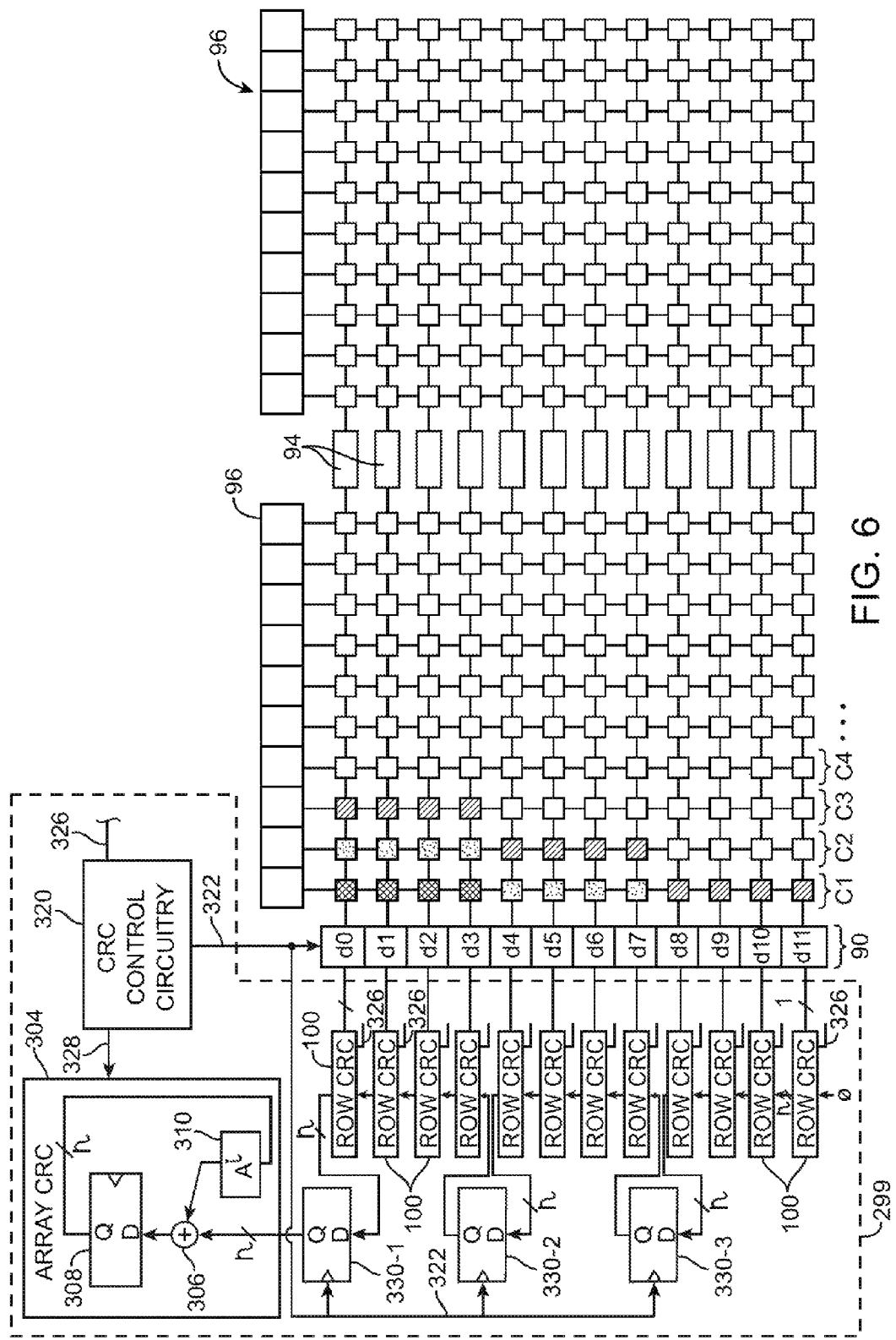
FIG. 6 is diagram of an illustrative integrated circuit having CRC circuitry that includes a chain of pipelined CRC circuits each of which receives bits from a corresponding row of memory elements in accordance with an embodiment of the present invention.

FIG. 6 shows another suitable arrangement of the present invention in which each row in the memory array has a dedicated CRC stage for computing a CRC value based on a single memory data bit and a CRC output provided from a preceding CRC stage. As shown in FIG. 6, error checking and control circuitry 299 may include a linear chain of row CRC circuits 100 each of which is operable to directly receive data bits from data register 90, an array CRC circuit 304, and associated CRC control circuitry 320.

Row CRC circuit 100 that is being used in the configuration of FIG. 6 may sometimes be referred to as a bit-level CRC stage and may be implemented based on the same mathematic concept that is described in connection with FIG. 4A. Each row CRC circuit 100 of FIG. 6 may have a first input operable to receive an incoming memory data bit from data register 90, a second input operable to receive an n-bit CRC value (Zi) from a preceding circuit 100, an output on which a resulting n-bit CRC value (Zo) is provided, and a clock control input operable to receive clock signals provided from CRC control circuitry 320 via path 326. In particular, the bottommost row CRC circuit may have a second input that is inactive (or shorted to ground). Techniques for unrolling and/or rearranging the linear chain of row CRC circuits 100 are within the scope of this invention and can be used to improve performance of circuitry 299.

In the example of FIG. 6, a pipeline register 330 (e.g., a respective one of pipeline registers 330-1, 330-2, and 330-3) may be interposed between each group of four consecutive row CRC circuits 100 to help increase throughput. Registers 330 and data register 90 may receive a common clock control signals from control circuitry 320 via path 326. As shown in FIG. 6, register 330-3 is interposed between a group of row CRC circuits corresponding to bits d8-d11 and a group of row CRC circuits corresponding to bits d4-d7, whereas register 330-2 is interposed between the group of row CRC circuits corresponding to bits d4-d7 and a group of row CRC circuits corresponding to bits d0-d3. Register 330-1 may serve as a CRC value buffer for the group of row CRC circuits corresponding to bits d0-d3. In general for memory arrays having hundreds or thousands of rows, a pipeline register 330 may be inserted every M consecutive CRC bit-level stages, where M may be equal to 16, 32, or other suitable value. A value M is determined based on a tradeoff between additional hardware cost and a reduction in performance due to larger delay between each pair of pipeline registers.

Array CRC circuit 304 may include a logic XOR circuit 306, a storage component such as register 308, and a CRC delay circuit 310. In particular, logic XOR circuit 306 may have a first input operable to receive an n-bit CRC output value from uppermost buffer register 330-1, a second input operable to receive an n-bit CRC output value from CRC delay circuit 310, and an output on which an updated array CRC value is provided (e.g., an updated CRC value that is generated by XORing the two n-bit CRC values received at its first and second inputs). Register 308 may have an input terminal (D) that receives the updated array CRC value from the output of logic XOR circuit 306, an output terminal (Q) on which a currently latched CRC value is provided to an input of CRC delay circuit 310, and a clock input operable to receive a clock signal from control circuitry 120 via path 328. In general, array CRC circuit 304 may produce an array CRC value having the same bit width as those produced by each of bit-level CRC stages 100 of FIG. 6.

Delay circuit 310 may serve to implement desired bit shifting as specified by matrix A. Matrix A in array CRC circuit 304 may be the same or may be different from matrix A (196) as described in connection with row CRC circuit 100 (see, FIG. 4A). In particular, array matrix A may be raised to a j-th power to effectively delay the position of each incoming CRC by j bit positions. Generally, the power j to which array matrix A should be raised may be at least equal to the number of rows in the memory array to prevent incoming CRC bit streams that are processed by array CRC circuit 304 from overlapping so that each possible error in the array CRC value uniquely identifies a location in the memory array. In the example of FIG. 3, j may be equal to 12 since there are 12 rows in the memory array. As another example in which device 10 includes a memory array having 10,000 rows, j will be equal to 10,000 or another value that is greater than 10,000.

For illustrative purposes, consider again the example of FIG. 6 where there are only four rows per pipeline register. In a first clock cycle, memory data in column C1 may be accessed and latched by data register 90. Data bits d0-d3 (e.g., bits from memory cells in the upper third of column C1) may be processed by corresponding row CRC circuits 100 to produce a first partial CRC value. Meanwhile, data bits d4-d7 (e.g., bits from memory cells in the mid third of column C1) may be processed by corresponding row CRC circuits 100 to produce a second partial CRC value. During the same clock cycle, data bits d7-d11 (e.g., bits from memory cells in the lower third of column C1) may be processed by corresponding row CRC circuits 100 to produce a third partial CRC value.

In a second clock cycle immediately following the first clock cycle, the first, second, and third partial results may be respectively latched by registers 330-1, 330-2, and 330-3 while memory data in column C2 is accessed and latched by data register 90. When the topmost buffer/pipeline register 330-1 latches a new CRC value, CRC circuit 304 may compute a new array CRC value (e.g., CRC circuit 304 may update the array CRC value). A first CRC value computed during the second clock cycle may represent a partial "diagonal" corresponding to memory cells associated with generation of the first partial CRC result.

During the second clock cycle, data bits d0-d3 (e.g., bits from memory cells in the upper third of column C2) and the second partial CRC value may be processed by corresponding row CRC circuits 100 to produce a fourth partial CRC value. Meanwhile, data bits d4-d7 (e.g., bits from memory cells in the mid third of column C2) and the third partial CRC value may be processed by corresponding row CRC circuits 100 to produce a fifth partial CRC value. During the same clock cycle, data bits d8-d11 (e.g., bits from memory cells in the lower third of column C2) may be processed by corresponding row CRC circuits 100 to produce a sixth partial CRC value.

In a third clock cycle immediately following the second clock cycle, the fourth, fifth, and sixth partial results may be respectively latched by registers 330-1, 330-2, and 330-3 while memory data in column C3 is accessed and latched by data register 90. Array CRC circuit 304 may compute a second CRC value that represents another partial diagonal corresponding to memory cells associated with generation of the fourth partial CRC result (see, similarly-shaded cells associated with the top group of cells in C2).

During the third clock cycle, data bits d0-d3 (e.g., bits from memory cells in the upper third of column C3) and the fifth partial CRC value may be processed by corresponding row CRC circuits 100 to produce a seventh partial CRC value. Meanwhile, data bits d4-d7 (e.g., bits from memory cells in the mid third of column C3) and the sixth partial CRC value may be processed by corresponding row CRC circuits 100 to produce an eighth partial CRC value. During the same clock cycle, data bits d8-d11 (e.g., bits from memory cells in the lower third of column C3) may be processed by corresponding row CRC circuits 100 to produce a ninth partial CRC value.

In a fourth clock cycle immediately following the third clock cycle, the seventh, eighth, and ninth partial results may be respectively latched by registers 330-1, 330-2, and 330-3 while memory data in column C4 is accessed and latched by data register 90. Array CRC circuit 304 may compute a second CRC value that represents a full diagonal stripe corresponding to memory cells associated with generation of the seventh partial CRC result (see, similarly-shaded cells associated with the top group of cells in C3). Performing error checking based on offset or skewed data bits may sometimes be referred to as performing error detection/correction across "diagonal stripes" or diagonal regions of memory. Processing may continue in this way until memory bits for the entire memory array has been processed. When all the partial and full diagonal stripes have been processed by circuit 304, circuit 304 may generate a final array CRC value indicative of the current state of error for the memory array on device 10. The example of FIG. 6 is merely illustrative. This approach of performing parallel CRC computation may be extended to memory arrays with hundreds or thousands of rows and with any suitable number of pipeline registers 330.

Figure 7:
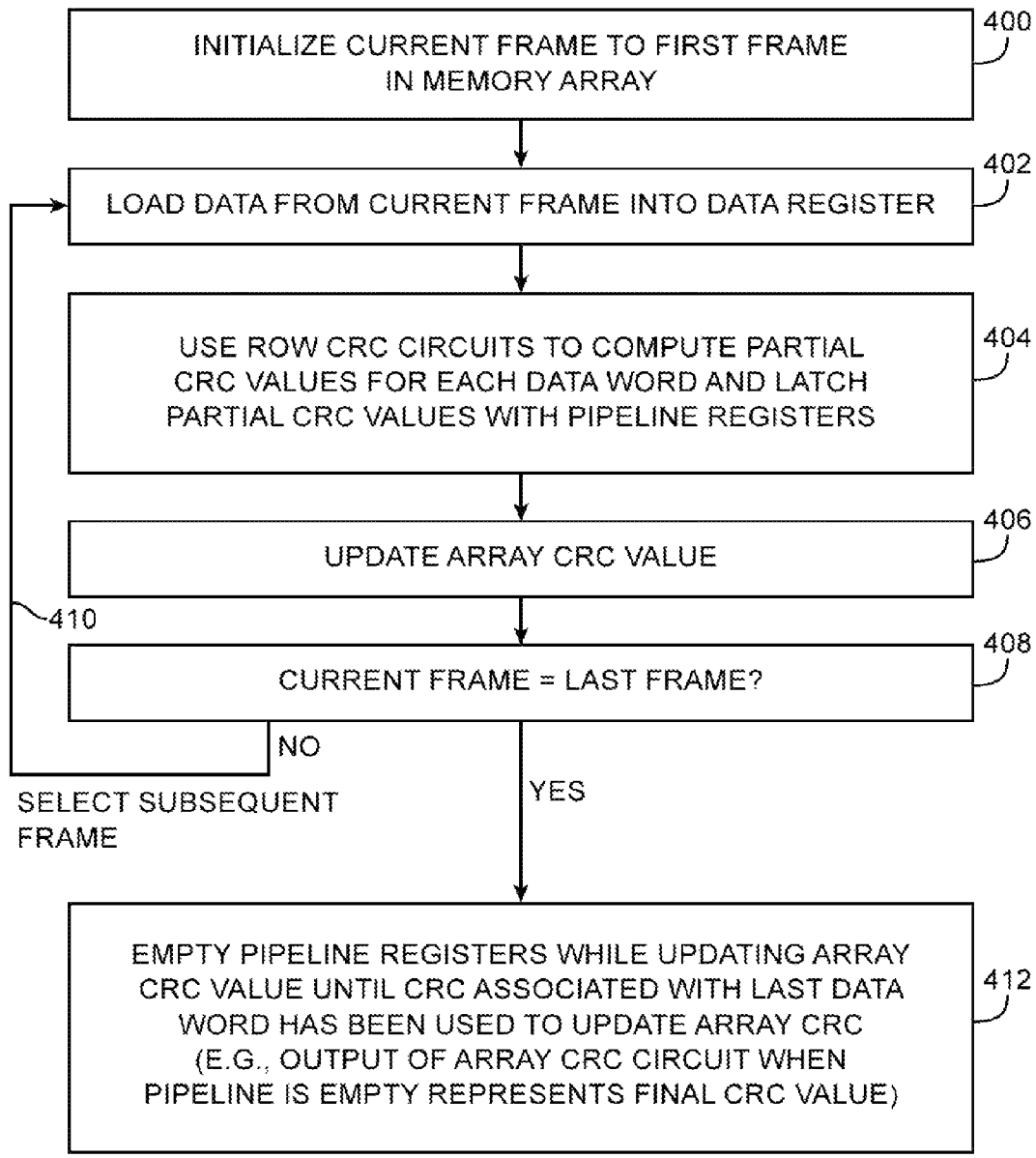
FIG. 7 is a flow chart of illustrative steps for performing error checking using CRC circuitry of the type shown in FIG. 6 in accordance with an embodiment of the present invention.

FIG. 7 is a flow chart of illustrative steps for performing memory error checking using circuitry 299 of the type described in connection with FIG. 6. At step 400, the current frame may be initialized to the first frame (column) in the memory array on device 10.

At step 402, memory cells in the current frame may be selected and read out to data register 90. At step 404, each group of consecutive row CRC circuits 100 (i.e., bit-level CRC stages that are not interrupted by intervening pipeline registers) may be used to compute a partial CRC value for an associated data word. The partial CRC values may be latched by associated pipeline registers 330.

At step 406, circuit 304 may update an array CRC value based on a newly latched CRC value presented at the output of register 330-1 (e.g., to take into account data words in partial or full diagonal stripes).

If the current frame is not the last frame in the memory array (as determined during step 408), processing may loop back to step 402 to select a subsequent frame for readout (as indicated by path 410). If the current frame is the last frame in the memory array, processing may continue to step 412.

At step 412, contents of pipeline registers 330 may be emptied while updating the array CRC value until the last single data word has been taken into account in computing the final CRC output (e.g., to process remaining data words associated with the partial diagonals at the right periphery of the memory array).

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit comprising:
   a plurality of memory elements; and
   a plurality of circuits each of which is operable to receive data from a respective group of memory elements in the plurality of memory elements, wherein the plurality of circuits is further operable to produce corresponding cyclic redundancy check (CRC) values in parallel.

2. The integrated circuit defined in claim 1, wherein the plurality of memory elements comprises an array of memory elements arranged in rows and columns, and wherein the plurality of circuits comprises a plurality of row cyclic redundancy check (CRC) circuits each of which is operable to receive data from a respective row of memory elements in the array.

3. The integrated circuit defined in claim 1, wherein the plurality of circuits comprises a chain of circuits, wherein a first circuit in the chain has a first input operable to receive data from a first group of memory elements and a second input, and wherein a second circuit in the plurality of circuits has an input operable to receive data from a second group of memory elements in the chain and an output that is coupled to the second input of the first circuit.

4. The integrated circuit defined in claim 3, further comprising:
   at least one pipeline register interposed between an adjacent pair of circuits in the chain of circuits.

5. The integrated circuit defined in claim 1, further comprising:
   a data register coupled between the plurality of memory elements and the plurality of circuits.

6. The integrated circuit defined in claim 1, wherein the plurality of circuits comprises a chain of circuits, further comprising:
   an array cyclic redundancy check (CRC) circuit operable to receive CRC values from the chain of circuits.

7. The integrated circuit defined in claim 6, wherein the array CRC circuit includes a cyclic redundancy check (CRC) delay circuit operable to delay CRC computation by a number of bits that is at least equal to a total number of circuits in the plurality of circuits.

8. An integrated circuit comprising:
   a plurality of memory elements; and
   a plurality of circuits each of which is operable to serially receive data from respective portions of a selected group of memory elements in the plurality of memory elements, wherein each circuit in the plurality of circuits is operable to simultaneously compute corresponding cyclic redundancy check (CRC) values based on the serially received data.

9. The integrated circuit defined in claim 8, wherein the plurality of memory elements comprises an array of memory elements arranged in rows and columns, and wherein the selected group of memory elements comprises memory elements that are coupled to a common address line.

10. The integrated circuit defined in claim 8, further comprising:
    a data register coupled between the plurality of memory elements and the plurality of circuits.

11. The integrated circuit defined in claim 10, further comprising:
    a plurality of multiplexing circuits coupled between the plurality of circuits and the data register.

12. The integrated circuit defined in claim 10, further comprising:
    a plurality of shift registers coupled between the plurality of circuits and the data register.

13. The integrated circuit defined in claim 8, further comprising:
    an array cyclic redundancy check (CRC) circuit that receives CRC values from the plurality of circuits after the plurality of circuits has finished computing CRC values based on data received from all memory elements in the plurality of memory elements on the integrated circuit.

14. The integrated circuit defined in claim 13, wherein the array CRC circuit includes a cyclic redundancy check (CRC) delay circuit operable to delay CRC computation by a number of bits that is less than a total number of circuits in the plurality of circuits.

15. A method for operating an integrated circuit having a plurality of memory elements, comprising:
    with a plurality of circuits, generating cyclic redundancy check (CRC) values in parallel based on data received from the plurality of memory elements; and
    with an additional circuit, combining the CRC values from the plurality of circuits by sequentially receiving respective CRC values from at least one of the plurality of circuits to produce an array CRC value that is used to determine whether the plurality of memory elements contains an error.

16. The method defined in claim 15, further comprising:
    with a cyclic redundancy check (CRC) delay circuit in the additional circuit, delaying CRC computation by a predetermined number of bits each time a new group of memory elements in the plurality of memory elements is selected for readout.

17. The method defined in claim 15, wherein the plurality of circuits comprises a chain of circuits, the method further comprising:
    with a plurality of pipeline registers interposed in the chain of circuits, buffering the CRC values generated by respective groups of circuits in the plurality of circuits.

18. The method defined in claim 15, wherein combining the CRC values with the additional circuit comprises combining the CRC values from the plurality of circuits using the additional circuit after the plurality of circuits has received data from all of the memory elements in the plurality of memory elements.

19. The method defined in claim 15, further comprising:
    sequentially selecting respective groups of memory elements in the plurality of memory elements for readout; and
    with a data register, latching data from the each selected group of memory elements in parallel.

20. The method defined in claim 19, further comprising:
    with control circuitry, sending control signals to the data register, the plurality of circuits, and the additional circuit.

* * * * *